United States Patent [19]

Weckler et al.

[11] 4,156,858
[45] May 29, 1979

[54] CHARGE TRANSFER TRANSVERSAL FILTER

[75] Inventors: Gene P. Weckler, Campbell; Robert W. Brodersen, Oakland, both of Calif.

[73] Assignee: Reticon Corporation, Sunnyvale, Calif.

[21] Appl. No.: 802,654

[22] Filed: Jun. 2, 1977

[51] Int. Cl.² ............ H03H 7/24; G11C 19/28; G06G 7/19
[52] U.S. Cl. ................. 333/165; 307/221 D; 333/173; 357/24; 364/826; 364/862
[58] Field of Search ........... 333/70 T, 70 A, 70 R; 357/24; 307/221 R, 221 C, 221 D, 304; 328/167; 364/602, 825–826, 841, 862, 864

[56] References Cited
U.S. PATENT DOCUMENTS 4,086,609  4/1978  Foxall et al. ............... 307/221 D X
4,123,733  10/1978  Poirier ............... 333/70 T

OTHER PUBLICATIONS

Sangster—"The Bucket-Brigade Delay Line, A shift Register for Analogue Signals" in Phillips Technical Review, vol. 31, No. 4, 1970; pp. 97-110.

Primary Examiner—Alfred E. Smith
Assistant Examiner—Marvin Nussbaum
Attorney, Agent, or Firm—Blakely, Sokoloff, Taylor & Zafman

[57] ABSTRACT

A transversal filter of the split electrode type employing a bucket-brigade device (BBD) is described. The BBD wells extend beyond the edges of the clocked gates of the BBD below second gates of different areas. These mask programmed second gates provide the filter output. Unlike other split electrode, capacitance sensing filters, these gates are not clocked, thus the filter has simplified output circuitry and a greater dynamic range.

8 Claims, 5 Drawing Figures

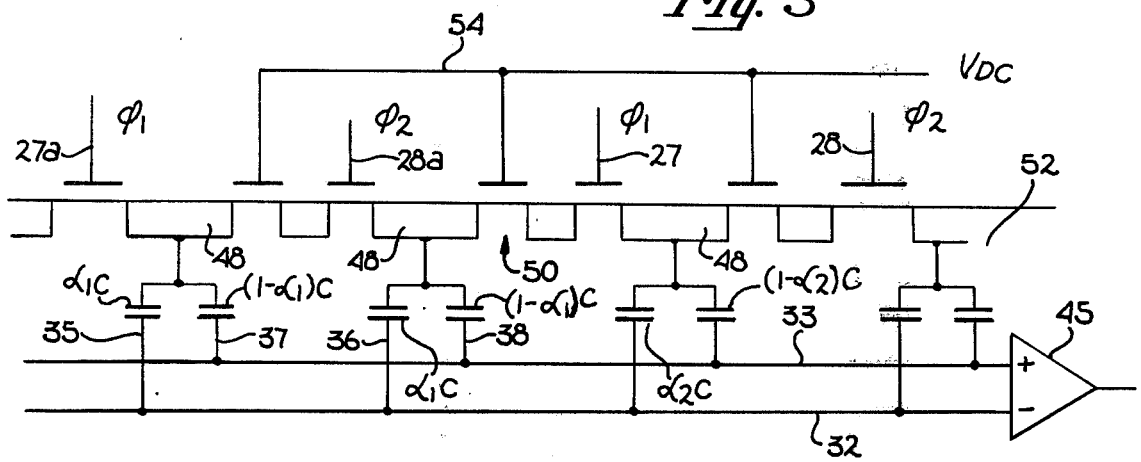

CHARGE TRANSFER TRANSVERSAL FILTER

BACKGROUND OF THE INVENTION

1. Field of the Invention

The invention relates to the field of transversal filters employing charge transfer devices, particularly those filters employing split electrode structures or capacitive sensing.

2. Prior Art

It is well-known in the transversal filter art to fabricate such filters with analog shift registers. Most often charge transfer devices such as bucket-brigade devices (BBD) or charge-coupled devices (CCD) are employed.

There are numerous known means for obtaining different tap weights at the stages of charge transfer devices in order to provide a predetermined filtering characteristic. Capactive and resistive tap weights are used in addition to binary weighting and other weighting means. For an example of BBD filters employing both capacitive weighting and resistive weighting, see U.S. Pat. No. 3,546,490, FIGS. 15 and 17.

Split electrode structures are employed in transversal filters to provide fixed tap weights. These filters are particularly suitable for integrated circuits since the split electrodes are easily defined by a photolithographic masking step. Split electrode filters provide high accuracy and moreover, may be fabricated at a relatively low cost. For a general discussion of transversal filters including filters employing split electrode structure, see *Charge Transfer Devices* by Sequin & Tompsett, published by Academic Press, Inc. 1975 beginning at page 216.

The charge transfer, split electrode transversal filters typically include a plurality of parallel clocked electrodes or gates formed over a channel. The gates associated with one clocking signal are split in a predetermined manner to provide the desired filter characteristic. In general, as charge is transferred under these split gates or electrodes its effect on the clock lines is sensed. The output signal is generally much smaller than the clocking signal, making the output circuitry relatively complex and reducing the dynamic range of the output signal. (A prior art split electrode filter will be discussed in conjunction with FIG. 1). For a general discussion of these problems see "The Design & Operation of Practical Charge-Transfer Transversal Filters", *IEEE Journal of Solid-State Circuits,* Volume. SC11, No. 1, February 1976 beginning at page 65, (See the discussion on page 68 beginning under the heading "Clocking & Signal Recovery".)

SUMMARY OF THE INVENTION

An integrated circuit, transversal filter fabricated on a substrate is described. The filter includes a bucket-brigade charge transfer means which has a plurality of wells disposed in the substrate. Transfer gates are fabricated above these wells for transferring charge from well-to-well in an ordinary manner when clocking signals are applied to these transfer gates. The wells extend beyond the edge of the transfer gates to form extended well regions. A plurality of second gates used for sensing charge are formed above these extended well regions. Each of these second gates has a predetermined area which is used to define the characteristics of the filter; these second gates are not clocked. The output signal from the filter may be sensed on the second gates. Thus, unlike prior art transversal filters of the split electrode type, the output signal may be sensed apart from the clocking signals.

BRIEF DESCRIPTION OF THE DRAWINGS

FIG. 3 is a circuit equivalent of the filter of FIG. 2 drawn in conjunction with a cross-sectional, elevation view of a substrate.

FIG. 4 is a plan view of an alternate embodiment of the transversal filter of the present invention.

FIG. 5 is a plan view which illustrates the manner in which the sensing gates are connected to a common line.

DETAILED DESCRIPTION OF THE INVENTION

A transversal filter of the split electrode type which employs a bucket-brigade device (BBD) is described. In the presently preferred embodiment, the filter is fabricated on a p-type silicon substrate with n-type well regions and with double layers of polycrystalline silicon for gate members (electrodes). The filter as will be seen, may be fabricated employing known photolithographic techniques.

In the following description, well-known circuits, fabrication techniques and theories of operation have not been described in detail in order not to obscure the inventive concepts of this patent in unnecessary detail. In other instances specific details have been provided such as specific conductivity types, in order to provide a thorough understanding of the inventive concepts and a description of the presently preferred embodiment. However, it will be obvious to one skilled in the art that the described inventive concepts may be employed without these specific details.

Figure 1:
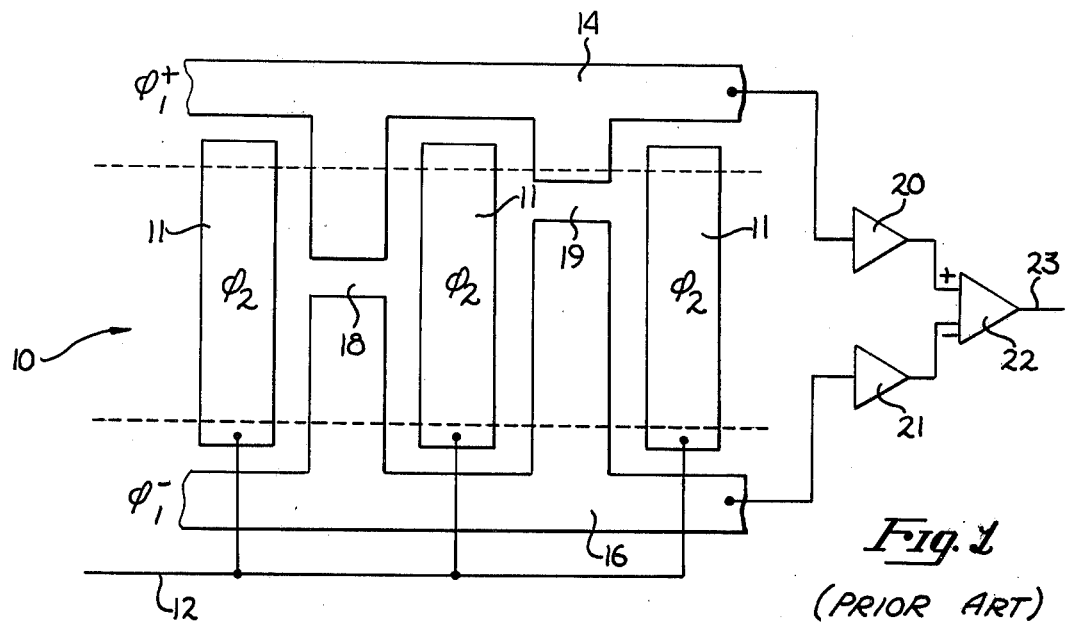
FIG. 1 is a plan view of a portion of a prior art split electrode transversal filter.

In FIG. 1 a typical embodiment of a prior art, split electrode transversal filter is illustrated. Thus filter includes a charge-coupled device (CCD) which transfers charge along the length of the channel 10. The channel 10 is typically formed in a substrate such as a silicon substrate and defined by elongated channel stop regions. The CCD includes (for the two phase embodiment shown) alternate gates 11 which are coupled to line 12, and which receive the $\phi_2$ timing signal. The $\phi_1$ timing gate are split as shown by splits 18 and 19 to form a first set of gates 14 and a second set of gates 16. The gates 14 and 16 receive the $\phi_1$ timing signal in order that charge may be transferred along the channel 10. The relative areas of the gates 14 and 16 over the channel 10 is determined by the position of the splits such as splits 18 and 19. These relative areas determine the capacitance of these gates, and hence the distribution of charge under these gates. The filter characteristics are defined (mask programmed) by the locations of the splits. The physical profile of these slits often resemble the impulse response of the filter.

As is apparent from FIG. 1, in order to sense the distribution of charge between the gates 14 and 16, it is necessary to reject the large common mode signal resulting from the clocking signal feed through. This typically is done by employing a differential amplifier such as differential amplifier 22. As is illustrated in FIG. 1, the gates 14 are coupled to one input terminal of the amplifier 22 through an amplifier 20. Similarly, the gates 16 are coupled to the other input terminal of the amplifier 22 through an amplifier 21. In practice, amplifiers 20 and 21 must be balanced. The amplifiers 20 and 21 and the differential amplifier 22 must be capable of handling the voltage swing of the $\phi_1{}^+$ and $\phi_1{}^-$ lines before differencing. Because of this, the dynamic range of the output signal on line 23 is limited.

Two embodiments of the invented transversal filter are described below with the first embodiment shown in FIGS. 2 and 3. With this embodiment sensing of charge is required along both sides of the BBD in order to obtain plus and minus coefficients. For the embodiment of FIG. 4, however, sensing need only be employed on one side of the array in order to obtain both the plus and minus coefficients.

Figure 2:
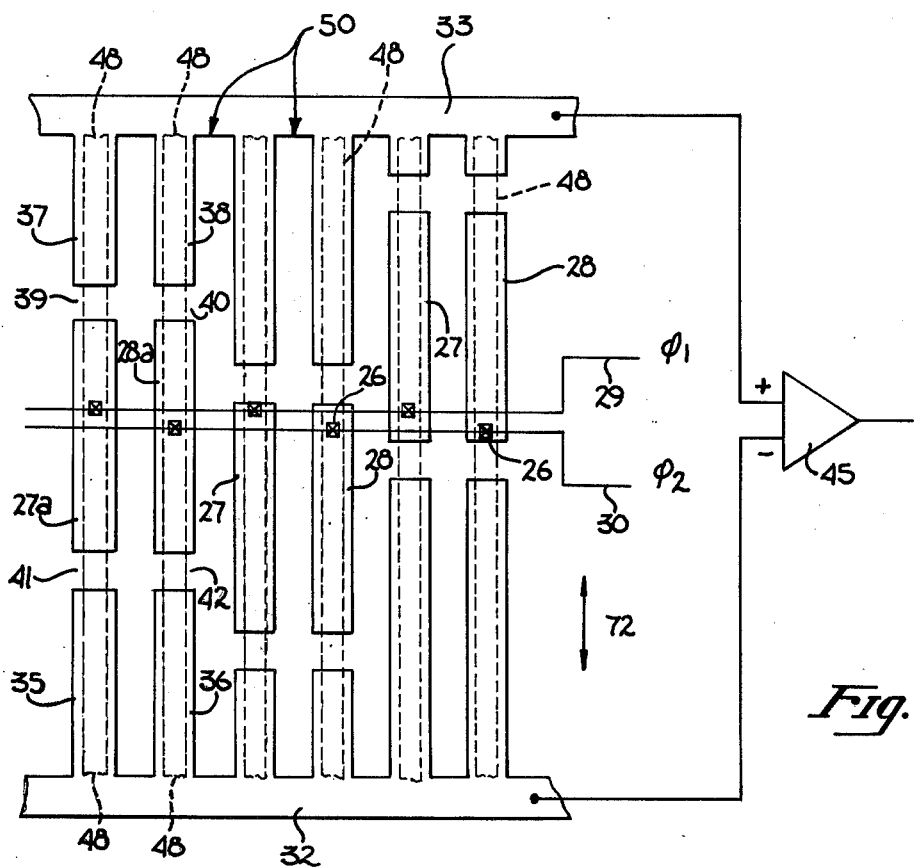
FIG. 2 is a plan view of a portion of a transversal filter fabricated in accordance with the present invention.

Referring more specifically to the embodiments of FIGS. 2 and 3, the transversal filter includes a BBD having a plurality of first spaced-apart, parallel, transfer gates 27 which are coupled to line 29 for receiving the $\phi_1$ timing signal. A second plurality of transfer gates 28, alternately disposed between the gates 27, are coupled to a common line 30 for receiving the $\phi_2$ timing signal. Gates 27 and 28 are fabricated from polysilicon and are insulated from the silicon substrate by a thermally grown oxide for the presently preferred embodiment. The lines 29 and 30 are transverse aluminum lines insulated from the gates, and coupled to the appropriate gates by contacts 26. In the presently preferred embodiment, the BBD employs a tetrode structure which includes a plurality of holding stages 50. These holding stages include gates which are coupled to line 54 (FIG. 3) for receiving a DC bias. In order not to complicate FIG. 2, these holding stages 50 have not been shown in this Figure. The BBD includes a plurality of n-type wells 48 which are diffused regions formed in the substrate 52 (FIG. 3). The BBD also includes other wells associated with the holding stages. For a detailed discussion of the BBD employed in the presently preferred embodiment, see "Bucket-Brigade Charge Transfer Means for Filters and Other Applications", Ser. No. 687,370, filed May 17, 1976, now abandoned in favor of Ser. No. 901,566 filed May 1, 1978 and assigned to the assignee of this patent and U.S. Pat. No. 4,100,513, FIGS. 4 and 5.

The wells 48 extend beyond the opposite edges of the gates 27 and 28 as is most clearly seen in FIG. 2. A plurality of first gates are formed along one side of the BBD over these wells and are coupled to a common line 33 such as gates 37 and 38. On the opposite side of the BBD, a plurality of second gates are formed above the extended well regions 48 such as gates 35 and 36. These plurality of second gates are connected to a common line 32. The plurality of first and second gates are sometimes referred to as sensing gates in this patent since they sense charge in the wells 48. The sensing gates are fabricated from polysilicon simultaneously with the formation of gates 27 and 28.

For the embodiment of FIGS. 2 and 3, the sensing gates are fabricated in pairs with each pair comprising two gates of equal area. For example, gates 37 and 38 form one pair of gates, each of these gates are of equal area. On the opposite side of the BBD, another pair of sensing gates 35 and 36 are formed with the area of gate 35 being equal to the area of gate 36. The filter thus comprises a plurality of parallel, spaced-apart, double split gate structures each of which comprise three aligned gates. For example, gates 37, 27a and 35 are in alignment and include splits 39 and 41. Similarly, gates 38, 28a and 36 are aligned and include slits 40 and 42. The total area for each of these three aligned gates, such as gates 37, 27a and 35, is equal as is apparent from FIG. 2, and importantly, the gate area for each of the transfer gates 27 and 28 is equal along the entire length of the BBD. However, as is apparent in FIG. 2 the transfer gates 27 and 28 are not in-line with respect to one another, but rather their relative location over the wells 48 is a function of the characteristics of the filter.

Referring briefly to FIG. 3, the lines 32 and 33 are coupled to input terminals of a differential amplifier 45. The transversal filter output signals (the plus and minus coefficients) are sensed at the output of amplifier 45. In FIG. 3 the relationships of the capacitances for the sensing gates is shown. It should be noted that the capacitances associated with gates 35 and 36 is equal. As will be seen for the embodiment of FIG. 4, the the capacitance of adjacent gates is not necessarily equal, thus allowing the positive and negative coefficients to be detected along a single side of the filter.

The transversal filter of FIGS. 2 and 3 operates in a somewhat similar fashion to prior art split electrode filters, however, the lines 32 and 33 are not clocked but rather may be biased at a DC potential. Summing occurs on lines 32 and 33 in a similar manner to the summing that occurs on gates 14 and 16 of FIG. 1. The weight given each stage is determined by the relative areas of the sensing gates in each stage, for example, referring to FIG. 2, the relative areas of gates 35 and 36 when compared to gates 37 and 38. By selecting these relative areas, the desired filter characteristics may be obtained in a similar manner to the selection of gate areas for the split electrode structure of the prior art. As with the prior art filters, the relative areas are easily formed by selecting the location of the splits.

The amplifier 45, unlike the amplifier 22 of FIG. 1, need not be capable of handling the voltage swing of the clocking signals $\phi_1$ or $\phi_2$. Amplifier 45 need only handle the potential sensed on lines 32 and 33. For this reason, the dynamic range of the filter's output signal may be substantially larger than that of the prior art filter of FIG. 1.

In the alternate embodiment of the transversal filter of FIG. 4, the filter again includes a BBD having a plurality of first transfer gates 60 coupled to line 63 for receiving the $\phi_1$ timing signal. A plurality of second transfer gates 61 are coupled to the line 64 and receive the $\phi_2$ timing signal. The BBD includes holding stages 58 which correspond to the holding stages 50 of the previous embodiment. Each of the n-type wells extend beyond the edges of the transfer gates. A plurality of sensing gates, such as sensing gates 65 and 67, are disposed above these wells along one side of the transfer gates. These gates are coupled to a common (summing) line 56. Similarly, on the other side of the transfer gates, a plurality of sensing gates such as gates 66 are disposed above the wells 68. These sensing gates are coupled to a common line 57. As in the case of the previous embodiment, the overall structure of the filter includes a plurality of parallel, spaced-apart, double split gate structures each formed in alignment such as the gates 65, 60a and 66. Unlike the previous embodiment, the sensing gates are not fabricated in pairs of equal area but rather the difference in area between adjacent sensing gates defines the characteristics of the filter.

Positive and negative coefficients may be obtained from either the lines 56 or 57. Thus, by way of example, the sensing gates coupled to line 57 need not be fabricated. In one embodiment, the line 56 is coupled to one input terminal of a differential amplifier 69. The other terminal of this differential amplifier receives a DC potential. Feedback is provided from the output terminal of amplifier 69 to one input terminal through a capacitor 71 and through a field-effect transistor 70. The transistor 70 couples the output terminal to input terminal when the reset signal is positive (assumming an n-channel, enhancement mode device).

For the embodiment of FIG. 4 the weighting coefficients for the stages, such as stage 1, is the difference in areas between the two adjacent sensing gates in that stage, for example, the difference in areas between gates 65 and 67. (Assumming sensing occurs on the $\phi_1$ and $\phi_2$ transfer and the signals have different voltage swings.) Stage 1 provides a positive coefficient, stage 2 a zero coefficient, and stage 3 a negative coefficient.

Assume for sake of discussion that the signal on line 56 is sensed when charge is transferred from the gates 60 to the gates 61; that is, for the n-channel embodiment, when the $\phi_2$ signal is positive relative to the $\phi_1$ signal. With the output circuitry of FIG. 4, the amplifier 69 operates as an integrater and maintains the potential on line 56 constant when sensing. Numerous other output circuits may be employed, for example, line 56 may be precharged to a predetermined potential during the reset period and deviations from this potential sensed during the $\phi_1$ to $\phi_2$ transfer.

Referring again to FIG. 2 during the fabrication of the filter the wells 48 are formed in the substrate prior to the formation of the transfer gates and sensing gates. Thus it becomes necessary to align the mask employed to define these gates relative to the wells 48. If misalignment occurs in the direction indicated by arrow 72 of FIG. 2, the characteristics of the filter will be altered. For example, if the gates are shifted relative to the diffusions 48, the capacitance associated with the gates 37 and 38 may be less than desired, and the capacitance associated with gates 35 and 36 may be more than desired. This problem is eliminated as is shown in FIG. 5 by interconnecting the sensing gates with their respective common line through a connection which is disposed along the side of the wells.

In FIG. 5 the gate 35 is again illustrated along with the well 48. The interconnection between the gate 35 and line 32 includes a lateral extension extending from the side of the gate 35 and a section 35a which is spaced-apart from the well 48. The line 32 is spaced-apart from the ends of the wells 48. The wells are longer than the three aligned gates, such as gates 35, 27a, and 37 (FIG. 2), thus even if misalignment occurs in the direction of the arrow 72, the capacitance of the sensing gates remains constant.

Thus, a transversal filter of the split electrode type, employing a BBD has been disclosed. Extended wells of the BBD allow sensing apart from the clocked transfer gates of the BBD. Simplified output circuitry may be employed and better dynamic range and accuracy is obtained with the improved filter.

We claim:

1. An integrated circuit, transversal filter disposed on a substrate comprising:
   a bucket-brigade charge transfer means formed on said substrate, said transfer means including a plurality of spaced-apart wells, each of which comprises a doped region in said substrate and a plurality of first gates, each of approximately equal area, above said wells for transferring charge from well-to-well when clocking signals are applied to said first gates;
   each of said wells extending beyond the opposite edges of said first gates transverse to the direction of said transferring charge to form oppositely disposed extended well regions;
   a plurality of pairs of second gates, each member of said pair disposed above one of said oppositely disposed extended well regions, each pair of said second gates having approximately equal area with the division of area between said members of each pair being predetermined so as to define the characteristics of said filter;
   whereby an output signal from said transversal filter may be sensed apart from said clocking signals on said second gates.

2. The filter defined by claim 1 wherein said second gates on each of said opposite edges of said first gate are coupled to common lines so as to provide summing nodes.

3. The filter defined by claim 2 wherein each of said wells comprises an n-type region in a p-type silicon substrate.

4. An integrated circuit, transversal filter disposed on a substrate comprising:
   a bucket-brigade charge transfer means formed on said substrate, said transfer means including a plurality of spaced-apart doped regions in said substrate and a plurality of transfer gates of approximately equal area above said regions for transferring charge from region-to-region when clocking signals are applied to said transfer gates;
   each of said regions extending beyond opposite edges of said transfer gate transverse to the direction of said transferring charge to form first and second oppositely disposed extended regions;
   a plurality of first sensing gates disposed above said first regions and coupled to a first line, each of said first sensing gates having a predetermined area used to define the characteristics of said filter;
   a plurality of second sensing gates disposed above said second regions and coupled to a second line, each of said second sensing gates having a predetermined area used to define the characteristics of said filter, the total area of said first and second gates disposed over each of said regions being approximately equal;
   whereby output signals from said transversal filter may be sensed apart from clocking signals on said lines.

5. The filter defined by claim 4 wherein the coupling between each of said sensing gates and said lines includes an extension of each of said sensing gates originating along a side of said sensing gates.

6. The filter defined by claim 5 wherein said region each comprise n-type regions in a p-type substrate.

7. The filter defined by claim 4 wherein said first sensing gates are formed in adjacent pairs of equal area and said second sensing gates are formed in adjacent pairs of equal area.

8. The filter defined by claim 4 wherein the difference in area between adjacent first gates and between adjacent second gates defines said characteristics of said filter.

* * * * *